United States Patent [19]
Lu et al.

[11] Patent Number: 5,756,392
[45] Date of Patent: May 26, 1998

[54] METHOD OF FORMATION OF POLYCIDE IN A SEMICONDUCTOR IC DEVICE

[75] Inventors: Hsiang-Fan Lu, Hsin-chu; Jhon-Jhy Liaw, Taipei; Chih-Ming Chen; Bu-Fang Chen, both of Taiwan, all of China

[73] Assignee: Taiwan Semiconductor Manuacturing Company, Ltd., Hsin-Chu, Taiwan

[21] Appl. No.: 787,194

[22] Filed: Jan. 22, 1997

[51] Int. Cl.⁶ .................. H01L 21/283; H01L 21/324
[52] U.S. Cl. ................ 438/592; 438/655; 438/657; 438/664
[58] Field of Search ............. 437/41, 193, 200; 438/592, 655, 657, 660, 663, 664, 770, 775, 787

[56] References Cited

U.S. PATENT DOCUMENTS

| | | | |
|---|---|---|---|
| 4,443,930 | 4/1984 | Huang et al. | 437/200 |
| 4,833,099 | 5/1989 | Woo | 437/41 |
| 5,234,850 | 8/1993 | Liao | 438/231 |
| 5,306,951 | 4/1994 | Lee et al. | 257/755 |
| 5,364,803 | 11/1994 | Lur et al. | 437/40 |
| 5,382,533 | 1/1995 | Ahmad et al. | 438/301 |
| 5,434,096 | 7/1995 | Chu et al. | 437/44 |

OTHER PUBLICATIONS

Yoo, C., et al., "Si/W Ratio Changes and Film Peeling during Polycide Annealing", Japanese J. Appl. Phys., vol. 29, No. 11, Nov. 1990, pp. 2535–2540, Nov. 1990.
Hara, T., et al., "Tungsten Silicide Films ... ", J. Electrochem. Soc., vol. 136, No. 4, Apr. 1989, pp. 1177–1180, Apr. 1989.
Wolf, S., et al., Silicon Processing, 1986, Lahice Press, vol. 1, pp. 56–58, 175–182, pp. 384–397, 1986.
Yen, H., et al., "Thermal treatment and Underlayer ... ", 1995 Int. symp. VLSI Tech., Syst., and Appl., May–Jun. 1995, pp. 176–179, 31 May–Jun. 2, 1995.

Primary Examiner—T. N. Quach
Attorney, Agent, or Firm—George O. Saile; Stephen B. Ackerman

[57] ABSTRACT

An method for the formation of polycide used for the gate electrode or interconnection metallization in semiconductor integrated circuit devices has been developed. The polycide is formed from doped amorphous silicon deposited from $SiH_4$ and $PH_3$ and tungsten silicide deposited from dichlorosilane ($SiH_2Cl_2$ and $WF_6$, followed by conventional RIE patterning. The key feature, annealing of the polycide structure by a combination of RTA (Rapid Thermal Anneal) in a nitrogen ambient, and then a furnace anneal in an oxygen ambient prevents deleterious sidewall growth on the polycide structure and results in a highly manufacturable process having high yield.

6 Claims, 2 Drawing Sheets

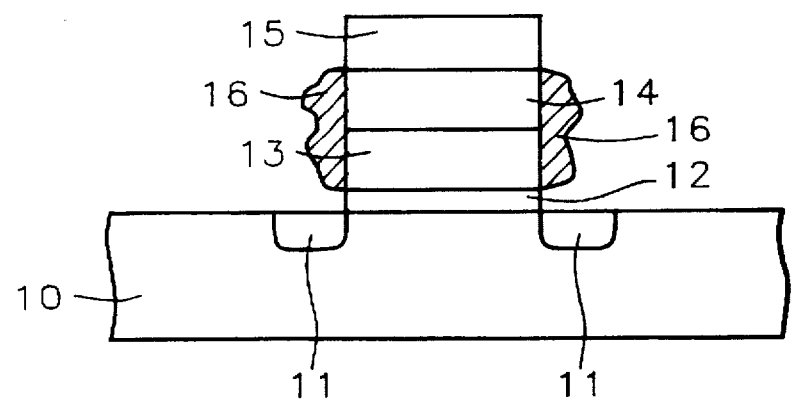
FIG. 1 – Prior Art
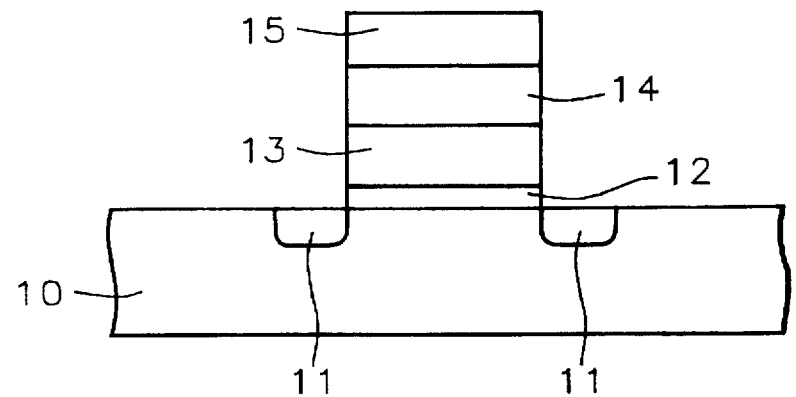
FIG. 2
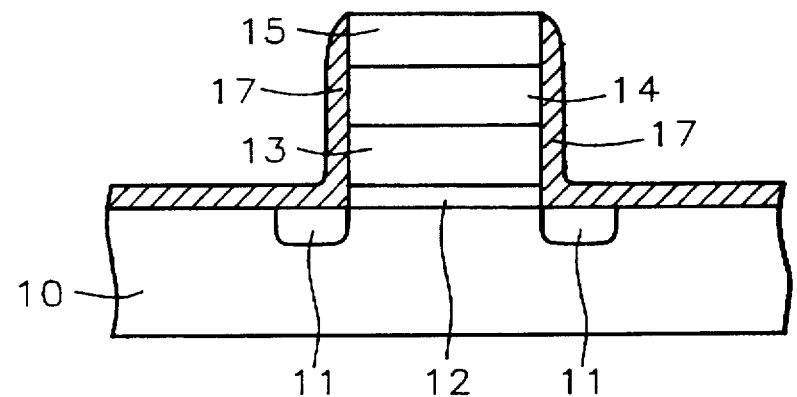
FIG. 3

METHOD OF FORMATION OF POLYCIDE IN A SEMICONDUCTOR IC DEVICE

RELATED PATENT APPLICATION

Ser. No. 08/899,688, filed Jul. 24, 1997 entitled METHOD OF MANUFACTURING A SEMICONDUCTOR IC DEVICE, Docket No. TSMC96-112.

BACKGROUND OF THE INVENTION

(1) Field of the Invention

This invention relates to a method of fabrication used for semiconductor integrated circuit devices, and more specifically to an improved process for the formation of polycide used for the gate electrode or interconnect metallization in integrated circuit devices.

(2) Description of Related Art

In the manufacture of semiconductor devices, the formation of conductive lines, such as the gate electrode in a MOSFET device or interconnections between IC devices, is a critical step in producing functioning and reliable circuits. Polycrystalline silicon is a material which is commonly used to form such gate electrodes and interconnections. In order to increase the conductivity of these gate electrodes and interconnection lines, a refractory silicide, such as tungsten silicide, is deposited on top of the polysilicon. Such a structure is referred to as polycide.

Numerous improvements to the polycide deposition process have been invented. For example, U.S. Pat. No. 5,306,951 entitled "Sidewall Silicidation For Improved Reliability and Conductivity" granted Apr. 26, 1994 to Roger R. Lee et al describes a structure for formation of a refractory silicide by depositing the refractory metal by sputtering on the sidewalls as well as the top of a polysilicon structure, thereby resulting in a more conductive structure.

Also, U.S. Pat. No. 5,364,803 entitled "Method of Preventing Fluorine-Induced Gate Oxide Degradation in WSi$_x$ Polycide Structure" granted Nov. 15, 1994 to Water Lur et al describes a method of tungsten polycide formation in which polysilicon is deposited, followed by deposition of a thin diffusion barrier layer consisting of tantalum nitride, then depositing tungsten silicide, and annealing the structure in nitrogen and oxygen at a temperature between about 800° and 1050° C. for a time between about 10 and 60 minutes.

While these inventions result in improvements to the polycide deposition process they do not address critical integrated circuit device manufacturability issues, such as interaction of previous and subsequent processing steps, overall process yield, device reliability, and cost.

The present invention is directed to a novel and improved method for the formation of polycide used for the gate electrode or interconnect metallization in integrated circuit devices, wherein manufacturability, manufacture process yield, and device reliability are improved.

SUMMARY OF THE INVENTION

One object of the present invention is to provide an improved method of fabricating polycide used for the gate electrode or interconnect metallization in semiconductor integrated circuit devices.

Another object of the present invention is to provide a new and improved process for fabricating polycide used for the gate electrode or interconnect metallization in semiconductor integrated circuit devices, wherein subsequent process steps do not degrade the integrity of the polycide.

A further object of the present invention is to provide a new and improved process for fabricating polycide used for the gate electrode or interconnect metallization in semiconductor integrated circuit devices, wherein the annealing process to form the polycide layer does not degrade the integrity of the polycide structure.

In accordance with the present invention, the above and other objectives are realized by using a method of forming a tungsten polycide interconnection structure over an oxide layer in an integrated circuit, comprising the steps of: providing the oxide layer on the surface of a semiconductor substrate; depositing a layer of doped amorphous silicon using LPCVD processing of SiH$_4$ (silane) and PH$_3$, at a temperature between about 560° and 580° C., to a thickness between about 900 and 1100 Angstroms; depositing a tungsten silicide layer on the layer of doped amorphous silicon to form tungsten polycide, using LPCVD processing of SiH$_2$Cl$_2$ (dichlorosilane) and WF$_6$, at a temperature between about 540° and 560° C., to a thickness between about 1200 and 1300 Angstroms; patterning of the tungsten polycide to form the tungsten polycide interconnection structure; and annealing the tungsten polycide interconnection structure first by RTA (Rapid Thermal Anneal) in nitrogen, at a temperature between about 790° and 810° C., for a time between about 30 and 40 sec; and then by a furnace anneal in oxygen, at a temperature between about 840° and 860° C., for a time between about 40 and 50 min.

BRIEF DESCRIPTION OF THE DRAWINGS

The object and other advantages of this invention are best described in the preferred embodiments with reference to the attached drawings that include:

FIG. 1, which schematically, in cross-sectional representation, illustrates the growth of a deleterious layer on the sidewalls of a polycide structure when the structure is annealed in a furnace in an oxygen ambient.

FIG. 2, which schematically, in cross-sectional representation, illustrates a patterned polycide structure.

FIG. 3, which schematically, in cross-sectional representation, illustrates a patterned polycide structure following the preferred embodiment of annealing first by RTA in nitrogen followed by a furnace anneal in oxygen.

DESCRIPTION OF THE PREFERRED EMBODIMENTS

Figure 4:
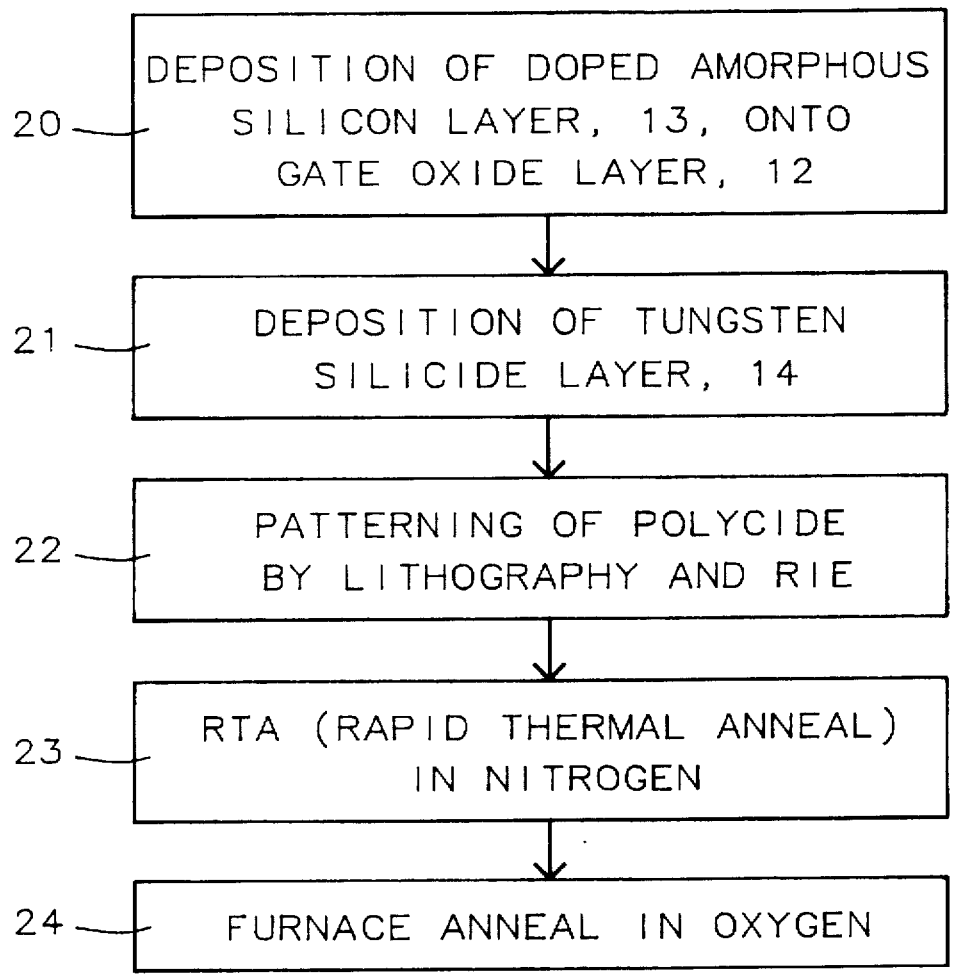
FIG. 4, which is a flow chart of the method of the preferred embodiment of the present invention.

The new and improved method of forming polycide used for the gate electrode or interconnect metallization in semiconductor integrated circuit devices will now be described in detail. The polycide gate electrode or interconnect metallization can be used, for example, in MOSFET devices that are currently being manufactured in industry; therefore only the specific areas unique to understanding this invention will be described in detail.

One objective of this invention is to have a manufacturable processs for fabricating polycide gate electrodes or interconnect metallization lines. The manufacturable process must produce high process yield and reliable devices. It is important that the polycide formation process result in reliable step coverage by the polycide over the topography of the semiconductor circuit device. Futhermore, the polycide formation process must not degrade the performance of the MOSFET device. For example, during processing to form the polycide gate electrode there must not be an increase in the thickness of the gate oxide. The process must, also, produce polycide gate electrodes or interconnect metallization lines which are not degraded during subsequent device manufacturing process steps. For example, manufacturing process steps, such as annealing must not degrade the integrity of the polycide. Also, deposition of an oxide layer subsequently to the polycide gate electrode or interconnection metallization formation must not degrade the integrity of the polycide gate electrode or interconnection metallization. Therefore, in selecting a manufacturable process for polycide used for the gate electrode or interconnection metallization in semiconductor circuit devices it is important to ascertain the effects of the polycide formation processes on the device and, also, the effects of subsequent process steps on the integrity of the polycide.

In general, the formation of polycide is accomplished by first depositing a layer of doped amorphous silicon by LPCVD, (Low Pressure Chemical Vapor Deposition), using $SiH_4$, $SiH_2Cl_2$, $SiHCl_3$, or $SiCl_4$ and $PH_3$. Then a layer of a refractory silicide, such as tungsten silicide, is deposited by LPCVD processing using $SiH_4$ and $WF_6$ or $SiH_2Cl_2$, and $WF_6$. Heat treatment, either in situ during tungsten silicide deposition, or subsequently to the tungsten silicide deposition, results in formation of the polycide. These are known processes in the semiconductor industry, but taken individually they do not address the overall manufacturability of an IC device. In order to assess the manufacturability of a process one has to ascertain the interaction of previous and subsequent process steps. For example, we have found that deposition of the doped amorphous silicon from $SiH_4$ and $PH_3$ is preferable because this is a highly reliable process, yielding high quality, defect-free doped amorphous silicon films having good step coverage over topography. This deposition process is well understood and is highly manufacturable. Also, deposition of the tungsten silicide layer from $SiH_2Cl_2$ and $WF_6$ is preferable to deposition from $SiH_4$ and $WF_6$ because of several manufacturing and process result issues. Firstly, film nucleation is more easily controlled, resulting in a tungsten silicide layer having: 1) No tungsten enrichment at the interface with the doped amorphous silicon, 2) No consumption of the doped amorphous silicon, and 3) No delamination at the interface. Secondly, tungsten silicide deposited from $SiH_2Cl_2$ and $WF_6$ has low fluorine content and good step coverage over surface topography. Thirdly, the deposition process results in a tungsten silicide layer having low mechanical stress, not subject to delamination after deposition.

On the other hand, if the polycide is formed from a tungsten silicide layer deposited from $SiH_2Cl_2$ and $WF_6$ onto a doped amorphous silicon layer, we have observed a deleterious effect during heat treatment of a patterned composite doped amorphous silicon/tungsten silicide structure to form polycide. This deleterious effect is illustrated in FIG. 1, where the semiconductor substrate, 10, has source and drain regions, 11, formed therein. Gate silicon oxide layer, 12, is formed on the surface of the substrate, 10. The polycide is formed from a doped amorphous silicon layer, 13, and a layer of tungsten silicide, 14, deposited from $SiH_2Cl_2$ and $WF_6$. Layer 15 is silicon oxide deposited, for example, from TEOS (tetraethylorthosilicate). Conventional photolithography and RIE (Reactive Ion Etching) are used to form the desired polycide gate electrode or interconnect metallization pattern. Heat treatment of the patterned polycide structure in a furnace in an oxygen ambient at temperatures between about 800° and 900° C. results in growth of an abnormal layer, 16, on the sidewalls of the polycide structure. This abnormal layer, 16, is subject to peeling and delamination.

Also, the discontinuity and nonconformality of the abnormal layer, 16, results in degraded process yield. Furthermore, after conventional heat treatment in a furnace in an oxygen ambient, the polycide is subject to delamination and peeling from the semiconductor substrate. These effects are unacceptable because they lead to device defects, degraded device performance and low process yield.

The object of the present invention is to provide a new and improved process for fabricating polycide used for the gate electrode or interconnection metallization in semiconductor integrated circuit devices, wherein the overall manufacturability is addressed.

Referring to FIG. 2, there is shown a portion of a partially completed integrated circuit. The semiconductor substrate, 10, is preferably composed of P-type, single crystal silicon with a <100> orientation. Source and drain regions, 11, are formed as is understood in the art either before or after formation of the gate structure. Gate silicon oxide layer, 12, is deposited over the surface of the substrate, 10. Typically, the gate oxide thickness is between about 75 and 95 Angstroms. Next, the gate doped amorphous silicon layer, 13, is deposited over the gate oxide using LPCVD (Low Pressure Chemical Vapor Deposition) processing of $SiH_4$ and $PH_3$, at a temperature between about 560° and 580° C., to a thickness between about 900 and 1100 Angstroms. A layer of tungsten silicide, 14, is deposited by LPCVD processing of $SiH_2Cl_2$ (dichlorosilane) and $WF_6$, at a temperature between about 540° and 560° C., to a thickness between about 1200 and 1300 Angstroms. Silicon oxide layer, 15, is deposited by conventional methods, such as deposition from TEOS (tetraethylorthosilicate). Using conventional photolithography and RIE (Reactive Ion Etching) techniques, the layers, 12, 13, 14 and 15, are patterned to form the desired polycide gate electrodes. Following patterning the polycide gate electrodes are annealed by a two step process comprising: firstly a RTA (Rapid Thermal Anneal) in a nitrogen ambient, at a temperature between about 790° and 810° C., for a time between about 30 and 40 sec; and then secondly by a furnace anneal in an oxygen ambient, at a temperature between about 840° and 860° C., for a time between about 40 and 50 min. FIG. 3 shows the resulting structure following the two step anneal process. Layer, 17, which grows during the two step anneal process is uniform in thickness and conformal to the patterned polycide structure. FIG. 4 is a process flow chart of the method of the preferred embodiment of the present invention illustrated in FIG. 3. Step 20 deposits a doped amorphous silicon layer onto a gate oxide layer. Step 21 deposits a tungsten silicide layer onto the doped amorphous silicon layer to form polycide. Step 22 patterns the polycide by lithography and RIE. Step 23 heat treats the polycide structure by RTA in nitrogen. Step 24 heat treats the polycide structure by a furnace anneal in oxygen.

The critical element of the present invention is the polycide anneal process which is a combination of RTA (Rapid Thermal Anneal) in a nitrogen ambient, and then a furnace anneal in an oxygen ambient. This combination of anneal steps prevents growth of an abnormal layer on the sidewalls of the polycide structure, which results when the polycide structure is annealed by conventional single-step heat treatment in a furnace in an oxygen ambient.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a tungsten polycide interconnection structure over an oxide layer in an integrated circuit comprising the steps of:

providing said oxide layer on the surface of a semiconductor substrate;

depositing a layer of doped amorphous silicon;

depositing a tungsten silicide layer on said layer of doped amorphous silicon to form tungsten polycide;

patterning of said tungsten polycide to form the tungsten polycide interconnection structure; and annealing said tungsten polycide interconnection structure by RTA (Rapid Thermal Anneal) in nitrogen, followed by a furnace anneal in oxygen.

2. The method of claim 1, wherein said layer of doped amorphous silicon is deposited using LPCVD processing of $SiH_4$ and $PH_3$, at a temperature between about 560° and 580° C., to a thickness between about 900 and 1100 Angstroms.

3. The method of claim 1, wherein said tungsten silicide layer is deposited using LPCVD processing of dichlorosilane ($SiH_2Cl_2$) and $WF_6$, at a temperature between about 540° and 560° C., to a thickness between about 1200 and 1300 Angstroms.

4. The method of claim 1, wherein the annealing of said tungsten polycide interconnection structure is by RTA (Rapid Thermal Anneal) in nitrogen, at a temperature between about 790° and 810° C., for a time between about 30 and 40 sec.; followed by a furnace anneal in oxygen, at a temperature between about 840° and 860° C., for a time between about 40 and 50 min.

5. A method of fabrication of a tungsten polycide interconnection structure over an oxide layer in an integrated circuit comprising the steps of:

providing said oxide layer on the surface of a semiconductor substrate;

depositing a layer of doped amorphous silicon using LPCVD processing of $SiH_4$ and $PH_3$, at a temperature between about 560° and 580° C., to a thickness between about 900 and 1100 Angstroms;

depositing a tungsten silicide layer on said layer of doped amorphous silicon to form tungsten polycide, using LPCVD processing of dichlorosilane ($SIH_2CL_2$) and $WF_6$, at a temperature between about 540° and 560° C., to a thickness between about 1200 and 1300 Angstroms;

patterning of said tungsten polycide to form the tungsten polycide interconnection structure; and annealing said tungsten polycide interconnection structure by RTA (Rapid Thermal Anneal) in nitrogen followed by a furnace anneal in oxygen.

6. The method of claim 5, wherein said annealing of said tungsten polycide interconnection structure comprises the steps of:

RTA (Rapid Thermal Anneal) in nitrogen, at a temperature between about 790° and 810° C., for a time between about 30 and 40 sec; and furnace anneal in oxygen, at a temperature between about 840° and 860° C., for a time between about 40 and 50 min.

* * * * *

UNITED STATES PATENT AND TRADEMARK OFFICE
CERTIFICATE OF CORRECTION

PATENT NO. : 5,756,392
DATED : 5/26/98
INVENTOR(S) : HSIANG-FAN LEE, JHON-JHY LIAW, CHIH-MING CHEN
BU-FANG CHEN

It is certified that error appears in the above-indentified patent and that said Letters Patent is hereby corrected as shown below:

On the title page, item (75)
chang "Hsiang-Fan Lu" to --Hsiang-Fan Lee--

Signed and Sealed this

Eleventh Day of August 1998

Attest:

BRUCE LEHMAN

Attesting Officer    Commissioner of Patents and Trademarks